(12) United States Patent
Li et al.

(10) Patent No.: US 6,805,283 B2
(45) Date of Patent: Oct. 19, 2004

(54) LITHOGRAPHY REWORK ANALYSIS METHOD AND SYSTEM

(75) Inventors: Kun-Pei Li, Hsinchu (TW); Hsiu-Lan Ting, Hsinchu (TW); Pao-Hsing Lin, Hsinchu (TW); Nai-Chun Li, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 129 days.

(21) Appl. No.: 10/064,381

(22) Filed: Jul. 9, 2002

(65) Prior Publication Data

US 2003/0029912 A1 Feb. 13, 2003

(30) Foreign Application Priority Data

Aug. 8, 2001 (TW) .................................. 90119298 A

(51) Int. Cl.[7] .............................................. G06K 13/00
(52) U.S. Cl. ...................................................... 235/375
(58) Field of Search ................................ 235/375, 376; 700/121, 117; 702/81, 181, 122; 257/E21.525; 438/5; 707/104.1, 3

(56) References Cited

U.S. PATENT DOCUMENTS

| | | | | |
|---|---|---|---|---|
| 5,625,816 A | * | 4/1997 | Burdick et al. | 707/103 R |
| 5,872,976 A | * | 2/1999 | Yee et al. | 717/127 |
| 5,878,190 A | * | 3/1999 | Gloyd et al. | 392/403 |
| 6,192,291 B1 | * | 2/2001 | Kwon | 700/121 |

* cited by examiner

Primary Examiner—Diane I. Lee
(74) Attorney, Agent, or Firm—Jianq Chyun IP Office

(57) ABSTRACT

A lithography rework analysis method and system. The method is applied to a system having a network server and a user computer having a browser interface. The method transfers initial data of various machines into the network database. The network database contains rework data of machines performing lithography rework operation. Analysis time node is input to the browser interface and the analysis time node is transferred to the network server. According to the analysis time node, the network server retrieves required data from the network database and displays the data on the browser interface. Rework data residing within the network database includes data table production time, product number, production line code, station code, department code, product code, mask rework pieces, measuring station, production machine, worker name, rework reason code, rework reason title, current status, wafer lot note item, rework time and rework region.

30 Claims, 4 Drawing Sheets

LITHOGRAPHY REWORK ANALYSIS METHOD AND SYSTEM

CROSS REFERENCE TO RELATED APPLICATIONS

This application claims the priority benefit of Taiwan application Ser. No. 90119298, filed Aug. 8, 2001.

BACKGROUND OF INVENTION

1. Field of Invention

The present invention relates to a lithography rework analysis method and system. More particularly, the present invention relates to a lithography rework analysis method and system that utilizes a network database.

2. Description of Related Art

In general, a machine station carrying out manufacturing needs to perform a few processing steps in sequence. Hence, a time record of these steps is essential for operators to conduct subsequent analysis. FIG. 1 is a schematic diagram showing the layout of a conventional manufacturing system. As shown in FIG. 1, a machine room 100 having a number of production stations is performing a series of steps in sequence. Different machine groups including 120, 140 and 160 are within the machine room 100. A machine labeled A in each group may perform a production operation, a machine labeled B in each group may measure product yield of a particular product and the remaining machines in each group may conduct some other post-production treatments. Here, the machine group 120 is used as a typical group of machines that undergo a series of lithography operations. A first raw database 102 and a second raw database 104 record execution time of each machine inside the group 120 during operation. Recorded data includes a station identification number of each machine, necessary equipment in a production process and names of the operators.

All the recorded data remains as the raw data without being sorted and analyzed data within the databases. When a station operator needs to analyze the yield of semi-finished or final product produced by a particular machine, or to analyze the operation timing in each manufacturing stage of a particular product by a particular machine, manual sorting is often required. Due to some unforeseen circumstances such as non-standard specifications, operational errors and incorrectly positioned equipment, a few of the products produced by the machining stations may be defective. These defective products must be reworked or discarded.

In general, the operational timing and related data stored inside the raw databases 102 and 104 may be printed out using a printing device 106. The printout data includes rework production data so that a machine operator may perform a data comparison or analysis. However, because the printout data contains unprocessed or unanalyzed raw data, the operator has to spend a lot of time sorting and processing the data.

Hence, the aforementioned scheme lacks a reworking decision mechanism that can provide full reworking data to facilitate the finding of reasons for reworking due to each machine. Ultimately, the analysis is often incomplete. In addition, the scheme offers little help to the operator in search for the required information. In general, a special reporting system has to be pre-installed automatically or manually before the required data is obtained.

SUMMARY OF INVENTION

Accordingly, one object of the present invention is to provide a lithography rework analysis method capable not only of integrating the reasons for reworking by various stations but also capable of retrieving relevant rework data without much manual manipulation by an operation analyst.

To achieve these and other advantages and in accordance with the purpose of the invention, as embodied and broadly described herein, the invention provides a lithography rework analysis method. The method includes transferring initial data of various machine stations to a network database for storage and inputting analysis time nodes from a browser interface. Thereafter, the analysis time nodes are transmitted to a network server so that the network server can retrieve required data from the network database according to the analysis time nodes and display the required data on the browser interface.

This invention performs a rework data analysis of the data produced by a machine that conducts a lithography development operation. Hence, the rework data within the plurality of rework data tables in the network database contains machine related rework data for conducting lithography operations. Machine related rework data generally includes report table generation time, lot number, production line code, station code, department code, product code, mask, reworking pieces, measuring station, production station, operator name, rework reason code, rework name, current status, chip lot note item, rework time and rework region and so on.

This invention also provides a lithography rework analysis system capable of actualizing the aforementioned lithography rework analysis method. The lithography rework analysis system includes a network server and a user computer. The network server links up with a network database and the user computer includes a browser interface. The browser interface permits the inflow of analysis time nodes and displays the required data retrieved by the network server from the network database according to the analysis time nodes.

In brief, batches of rework data are normally transferred to a network database.

Later on, if a user needs the reason for a particular rework performed at a machine at a particular time, the user may retrieve the information through the network server from the network database.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
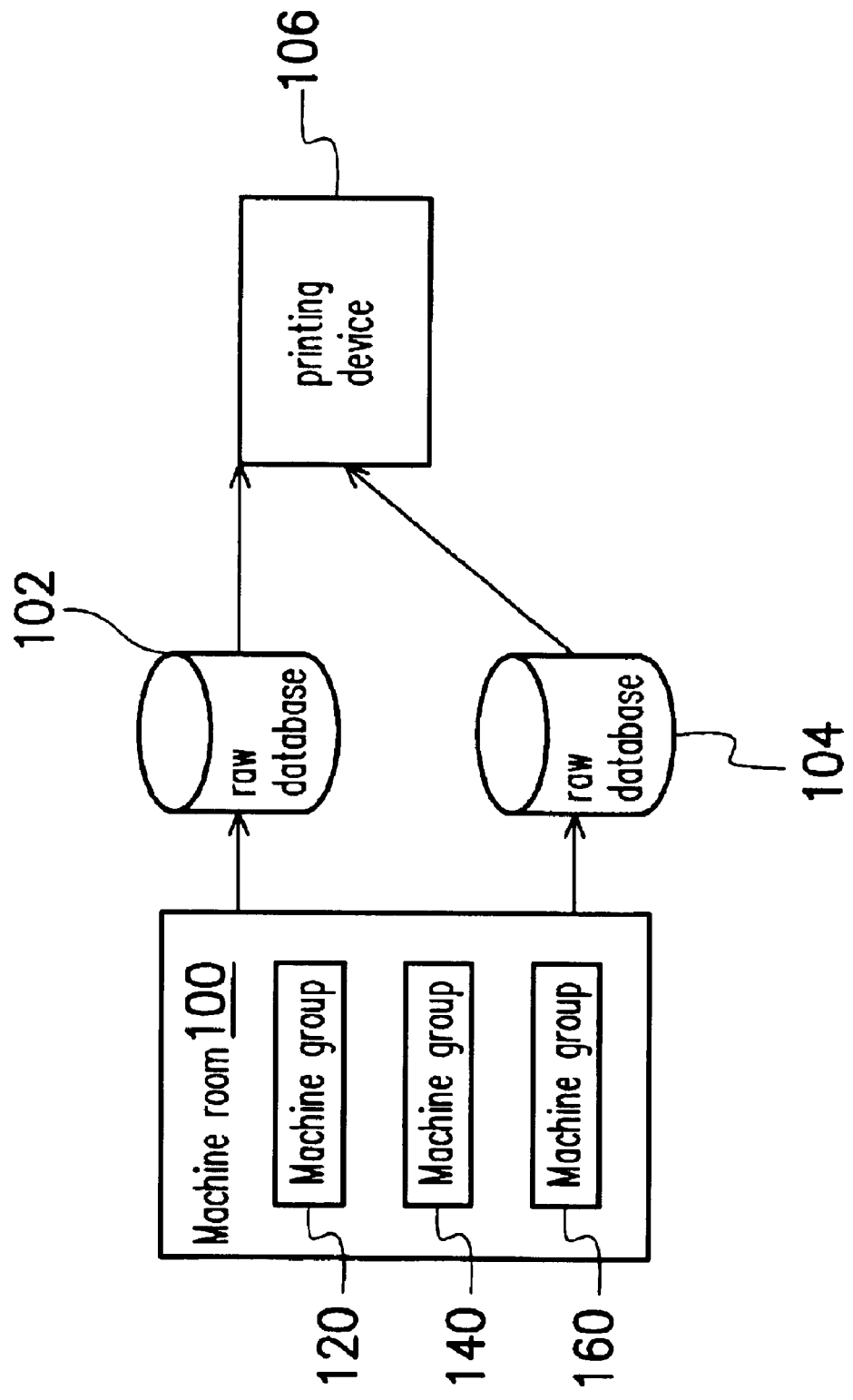
FIG. 1 is a schematic diagram showing the layout of a conventional manufacturing system.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
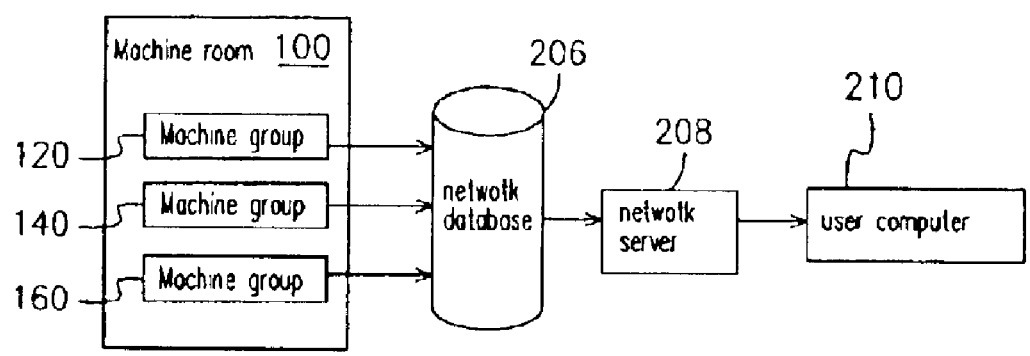
FIG. 2a is a schematic diagram of a lithography rework analysis system according to a first embodiment of this invention.

FIG. 2a is a schematic diagram showing the layout of a lithography rework analysis system according to a first embodiment of this invention. The system includes a network server 208 and a user computer 210. The network server 208 links up with a network database 206. The user computer 210 contains a browser interface (not shown) that permits a user to input analysis time node and display data retrieved by the network server 208 from the network database 206 according to the particular time node.

Since one of the principle applications of this invention is to obtain rework data from machines that conduct lithography operations, lithography rework data in the network database 206 should include a machine"s product code, production line code, station code, department code, product code, and production parameters of lithography stations—mask, reworking pieces, measuring station, production station, operator name, rework reason code, rework type, current status, chip lot note item, rework time, rework region and so on.

Figure 3:
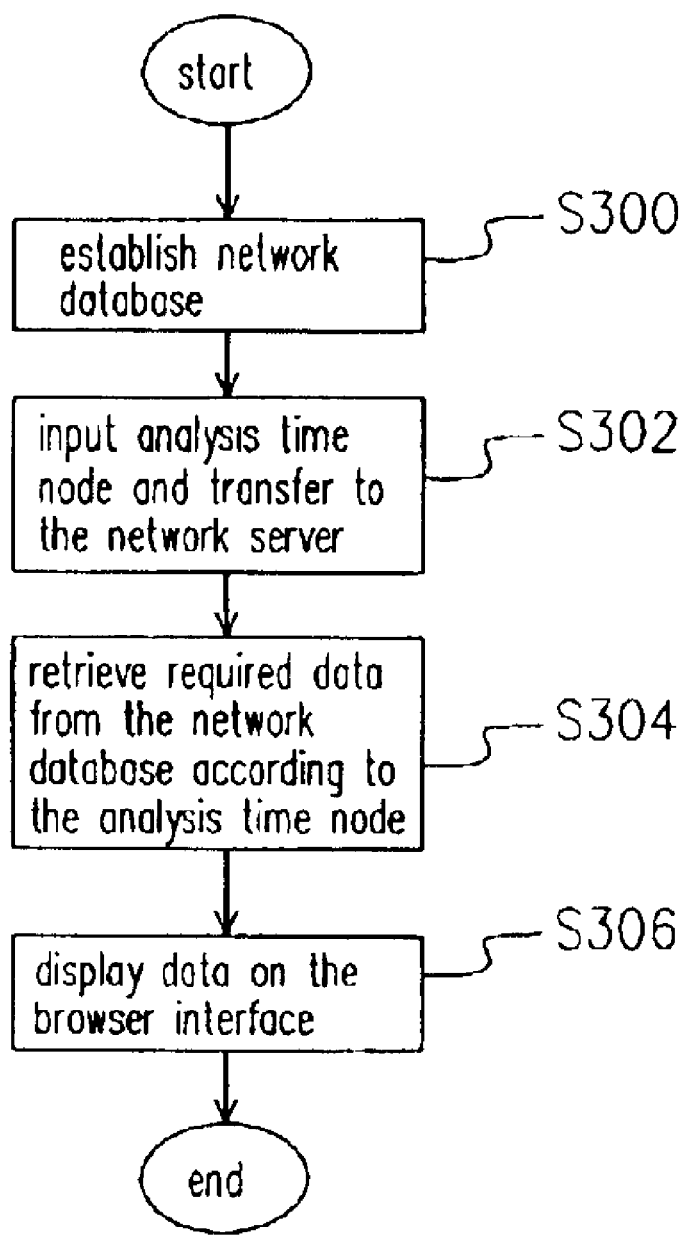
FIG. 3 is a flow diagram showing the steps in a lithography rework analysis according to this invention.

FIG. 3 is a flow diagram showing the steps in a lithography rework analysis according to this invention. The method is suitable for network server 208 and user computer 210 having a browser interface (not shown). The method targets at the machines within a machine group 120 in conducting a series of lithography treatments and performing an analysis to generalize a reworking reason. Although the following describes the analysis of rework data produced by the machines within a typical group 120, other groups such as 140 and 160 executing identical or dissimilar production steps may be similarly described.

Since this embodiment mainly describes the rework data produced when a lithography machine group conducts a rework operation, rework data related to rework operations carried out by the lithography machine group are stored in the network database 206. The lithography machines inside the group are production machines that manufacture circuit elements.

The lithography rework analysis is conducted in several steps. In step s300, initial data of various stations within a group is transferred to the network database 206 for storage. In step S302, time nodes for analysis is transferred to the network server 208. In step S304, a user may input the time node via the browser interface to inquire about particular rework data. In step S306, the network server 208 retrieves the required data from the network database 206 and displays the rework data on the browser interface of the user computer 210.

Figure 2B:
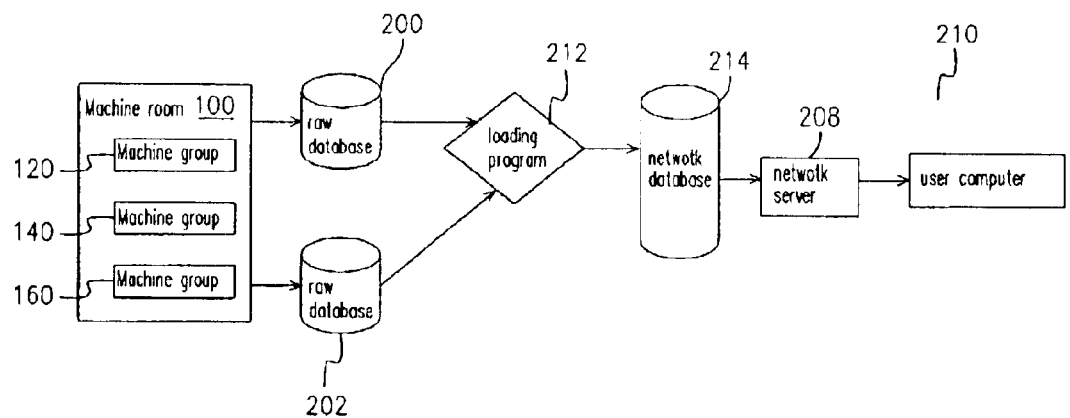
FIG. 2b is a schematic diagram of a lithography rework analysis system according to a second embodiment of this invention.

FIG. 2b is a schematic diagram of a lithography rework analysis system according to a second embodiment of this invention. Similarly, a network server 208 and a user computer 210 are also included in the lithography rework analysis system and they function in a similar way. However, a loading program 212 is added to the system.

Among the steps needed to conduct a rework analysis in this invention, initial data from the lithography machines within the group 120 during operation are stored in a first raw database 200 and a second raw database 202 instead of directly stored in the network database 206. The initial data held in the raw databases 200, 202 are unprocessed data. Since only a portion of the initial data is rework data when the stations participates in a rework operation, the raw databases 200 and 202 contain both production data as well as rework data. The unprocessed data within the raw databases 200 and 202 presents great difficulties to operators when a data analysis is required.

The unprocessed data within the raw databases 200 and 202 is processed in step S300 of FIG. 3 by passing the data into the loading program 212 before transferring the same into the network database 212. The loading program 212 not only sorts out production and rework data produced by the lithography machine group, but also performs a standard categorization of the data before transferring the same to the network database.

Since subsequent steps coming after the step S300 are entirely identical with those in the first embodiment, detailed description of the other steps is not repeated here. The production and rework data categorized by the loading program 212 is stored in the network database 214 in table format. Hence, the production and rework data can be easily retrieved. In addition, a table generation timetable is also provided in the network database 214 so that a user may retrieve the required data at any time.

In FIG. 2a, the network database 206 stores the production data of all station groups inside the machine room 100. In FIG. 2b, the network database 214 holds production and rework data that have been categorized by the loading program 212 and formatted into tables.

Data tables held in the network database 214 includes worker number, worker name and correspondence table, rework reason code and reason table corresponding to rework reason title, photo-rework table for all machine rework data, layer-tunnel table corresponding to the productivity of each group, total-wafer table corresponding to the productivity of each group, tool-tunnel table corresponding to the productivity of each group and each layer table corresponding to the rework data of each group.

The following illustrates automatic retrieving of different required data through the network server 208 after inputting analysis time node to the network server 208.

1. Obtaining rework data that relates to the production machine:In this embodiment, the production machine is the machine in the lithography operation group that conducts a masking operation. Since group code and station code of the production machine belonging also to the measuring machine of the group can be obtained from the rework data, the last three codes of the station code of the production machine requiring rework must be a production code. Hence, the network server 208 judges if the group code of the station is equal to the group code of the measuring machine and if the last three codes of the station code of the machine are the production machine code or not. If the last three codes are the production machine code, the machine is set to be the production machine of the measuring machine. Otherwise, the next machine is searched and a comparison is performed. The related rework data from the production machine obtained in this manner is the required data.

The above manner of obtaining related rework data of a production machine are represented in programming code as: If (group code of machine==group code of measuring machine) And (the last code of the station code of the machine is 040)Then (set the machine to be the production machine of the measuring machine)Else (search for the next machine).

Using the above program fragment, related rework data of the production machine is obtained. Here, the production station code is assumed to be 040.

2. Obtaining masking data during production: Since the mask used in the same group of machines must be identical to the one used in the production machine, the network server 208 sets the machine mask equivalent to the production machine mask.

The above step may be represented using a program fragment, Set (machine mask=production machine mask). Hence, mask data for a related machine to conduct a production operation is obtained.

3. Obtaining a list of all users that conduct rework operations. The network database contains correspondence data between the names of all company workers and their worker numbers. The network server 208 will determine if a particular worker's number is in the network database. If there is, name of the worker performing a particular rework operation can be found from the network database 206.

For example, if a correspondence "Security table" containing all the workers and worker number of a company is provided, an operator performing a rework operation may be automatically retrieved from the Security table. In other words, If (worker number==Security.worker number) Then (set NAME=Security.NAME).

4. Obtaining the rework reason title related to the rework operation: The network database contains correspondence data between all rework reason titles for rework operation by the production machine and rework reason code. The network server 208 determines if the rework reason code resides in the network database 206 or not. If the rework reason code is in the network database 206, the rework reason title may be found from the network database 206 using the rework reason code.

For example, if a correspondence "Reason table" containing all rework reason titles for a rework operation by the production machine and the rework reason code is provided, the name of the worker performing a particular rework operation may be found from the Reason table using a program. In other words, If (Rework reason code==Reason.Rework reason code) Then (Set Rework reason title=Reason.Rework reason title).

5. To produce a percentage statistic of various rework reasons, the network server 208 follows a two-step inquiry. In the first step, according to an input analysis time node, data such as rework reason titles, rework lot and rework pieces are extracted from all rework data in the network database. In the second step, data such as production pieces at the input analysis time node under an identical step one inquiry condition are extracted from machine production data in the network database. These steps are represented by a program code: Select (Rework reason title, rework lot, rework pieces) From (Photo-rework table) Where (Date==input analysis time node) Union Select (Production pieces) From (Total-Wafer table) Where (Date==input analysis time node).

The above five-instruction processing steps can be carried out by inputting the analysis time node for the desired data into the browser interface while the lower instructions is used when a user needs to understand the rework condition under a particular rework reason. The user needs to input the rework reason as well as the analysis time node.

6. If a user needs to know the rework condition of all machines under a rework reason title REG-overlap misalignment, the network server 208 follows a two-step inquiry. In the firs step, according to the analysis time node and the rework reason REG-overlap misalignment condition, related information about the machine such as production technique code, product code, mask, rework lot and rework pieces is extracted from all rework data in the network database. In the second step, production piece data such as production technique code, product code, mask and input analysis time node under identical condition as the first inquiry are obtained from the production quantity data of each group in the network database. These steps are represented by a program code: Select (Production technique code, product code, mask, rework lot, rework pieces) From (Photo-rework table) Where (Rework reason title==REG-overlap misalignment) and (Date==input analysis time node) UNION Select (Production pieces) From (Layer-tunnel table) Where (Production technique code, product code, mask==Production technique code, product code and mask of Photo-rework table) and (Date==input analysis time node).

7. If a user needs to know the rework condition of all machines under a rework reason title DCD (out-of-standard) condition, the network server 208 follows a two-step inquiry. In the firs step, according to the analysis time node and the rework reason DCD (out-of-standard) condition, related information about the machine such as production technique code, product code, mask, rework lot and rework pieces is extracted from all rework data in the network database. In the second step, production piece data such as production technique code, product code, mask and input analysis time node under identical condition as the first inquiry are obtained from the production quantity data of each group in the network database. These steps are represented by a program code Select (Production technique code, product code, mask, rework lot, rework pieces) From (Photo-rework table) Where (Rework reason title==DCD) and (Date==input analysis time node) UNION Select (Production pieces) From (Layer-tunnel table) Where (Production technique code, product code, mask== Production technique code, product code and mask of Photo-rework table) and (Date==input analysis time node).

8. To obtain the rework condition of a particular machine within a particular group when the rework reason is REG-overlap misalignment, the network server 208 automatically retrieves the required data from the network database. The required data including machine name, rework lot, rework pieces, production pieces are retrieved according to the input analysis time node and the rework reason REG-overlap misalignment. The steps are represented by a program code: Select (Machine name, rework lot, rework pieces, production pieces) From (Tool-tunnel table) Where (Date==input analysis time node) and (Rework reason title=REG-overlap misalignment).

9. To obtain the rework condition of a particular machine within a particular group when the rework reason is DCD-CD out of specification, the network server 208 retrieves the required data from the network database. The required data including machine name, rework lot, rework pieces and production pieces are retrieved from the network database according to the input analysis time node and the rework reason DCD-CD. The steps are represented by a program code: Select (Machine name, rework lot, rework pieces, production pieces) From (Tool-tunnel table) Where (Date==input analysis time node) and (Rework reason title==DCD-CD out of specification).

10. Steps to obtain the rework conditions such as scanner down, track down, poor coating, arrow shade, defocus, poor development, abnormal focus, optical group shift or peeling, wafer tilt due to cleaning, no dummy pattern, no photoresist, wafer edge mark, reject wafer for a particular machine in a particular group when the input rework reason is hardware issue, the network server 208 will retrieve the required data including machine name, rework lot, rework pieces, production pieces according to the input analysis time node and the rework reason H/W issue are represented by the code:

Select (Machine name, rework lot, rework pieces, production pieces) From (Tool-Tunnel table) Where (Date=input analysis time node) and (Rework reason title==H/W issue).

11. To obtain the rework condition when the input rework reason is track down, stepper/scanner down, reject wafer, the network server 208 retrieves data such as machine name, rework lot, rework pieces and production pieces of all machines from the network database according to the input analysis time node and rework reason track down, stepper/scanner down and reject wafer. The steps are represented by the code: Select (Machine name, rework lot, rework pieces, production pieces) From (Photo-rework table) Where (Date==input analysis time node) and (Rework reason title==track down; stepper/scanner down; reject wafer).

12. To obtain the rework condition when the input rework reason is poor coating-incorrect overlay, the network server 208 retrieves data such as machine name, rework lot, rework pieces and production pieces of all machines from the network database according to the input analysis time node and rework reason poor coating-incorrect overlay. The steps are represented by the code: Select (Machine name, rework lot, rework pieces, production pieces) From (Photo-rework table) Where (Date ==input analysis time node) and (Rework reason title==Poor coating-incorrect overlay).

13. To obtain the rework condition when the input rework reason is defocus-incorrect focus, the network server 208 retrieves data such as machine name, rework lot, rework pieces and production pieces of all machines from the network database according to the input analysis time node and rework reason defocus-incorrect focus. The steps are represented by the code: Select (Machine name, rework lot, rework pieces, production pieces) From (Photo-rework table) Where (Date==input analysis time node) and (Rework reason title==Defocus-incorrect focus).

14. Steps to obtain the rework condition when the input rework reason is beyond time range, non-lithography region request, engineering test, wafer test, erroneous operation, pressure drop, percentage rework pieces due to vibration, the network server 208 retrieves data such as machine name, rework lot, rework pieces and production pieces of all machines from the network database according to the input analysis time node and rework reason beyond time range, non-lithography region request, engineering test, wafer test, erroneous operation, pressure drop, percentage rework pieces due to vibration are represented by the code: Select (Machine name, rework lot, rework pieces, production pieces) From (Photo-rework table) Where (Date==input analysis time node) and (Rework reason title==Beyond time range, non-lithography region request, engineering test, wafer test, erroneous operation, pressure drop, percentage rework pieces due to vibration).

The $6^{th}$ to the $14^{th}$ instructions described above are used when a user wants to know rework conditions under a particular rework reason. The following describes instructions for obtaining manufacturing technique and product rework conditions under a particular rework reason. Besides inputting analysis time node for a particular inquiry, the user must input the rework reason, manufacturing technique code and product code as well.

15. To obtain the percentage of rework pieces of a particular group relative to the production pieces of the whole group, the network server 208 retrieves from the network database the rework data such as manufacturing technique code, mask, rework lot, rework pieces, production pieces of each group according to the input manufacturing technique code, product code and analysis time node. The steps are represented by the code: Select (Manufacturing technique code, mask, rework lot, rework pieces, production pieces) From (Each-Layer table) Where (Manufacturing technique code, product code, date==User input manufacturing technique code, product code, analysis time code).

16. To obtain the percentage of rework pieces of a particular group relative to the production pieces of the whole group when the rework reason is REG-overlap misalignment, the network server 208 retrieves from the network database the rework data such as manufacturing technique code, mask, rework lot, rework pieces and production pieces of each group according to the input manufacturing technique code, product code, analysis time node and the rework reason REG overlap misalignment. The steps are represented by the code: Select (Manufacturing technique code, mask, rework lot, rework pieces, production pieces) From (Each-Layer table) Where (Manufacturing technique code, product code, date==User input manufacturing technique code, product code, analysis time code) and (Reason=REG-overlap misalignment).

17. To obtain the percentage of rework pieces of a particular group relative to the production pieces of the whole group when the rework reason is DCD (out of specification), the network server 208 retrieves from the network database the rework data such as manufacturing technique code, mask, rework lot, rework pieces, production pieces of each group according to the input manufacturing technique code, product code, analysis time node and the rework reason DCD (out of specification). The steps are represented by the code: Select (Manufacturing technique code, mask, rework lot, rework pieces, production pieces) From (Each-Layer table) Where (Manufacturing technique code, product code, date==User input manufacturing technique code, product code, analysis time code) and (Reason= DCD).

18. To obtain the percentage of rework pieces of a particular group relative to the production pieces of the whole group when the rework reason is an H/W issue (that is, scanner down, track down, poor coating, arrow shadow, defocus, poor development, abnormal focus, optical group shift or peeling, wafer tilt due to cleaning, no dummy pattern, no photoresist, wafer edge mark and reject wafer), the network server 208 retrieves from the network database the rework data such as manufacturing technique code, mask, rework lot, rework pieces, production pieces of each group according to the input manufacturing technique code, product code, analysis time node and the rework reason H/W issue. The steps are represented by the code: Select (Manufacturing technique code, mask, rework lot, rework pieces, production pieces) From (Each-Layer table) Where (Manufacturing technique code, product code, date==User input manufacturing technique code, product code, analysis time code) and (Reason=H/W issue).

Rework rate can be computed using data such as rework pieces and production pieces obtained from aforementioned instructions 5 to 8 so that the rework rate of all machines, a particular group or a particular machine within a particular group (rework pieces/production pieces) can be found.

The critical elements in every instruction are the names of data tables inside the word "From". These data tables, including the Reason table, the Photo-rework table, the Layer-tunnel table, Total-wafer table, Tool-Tunnel table and the Each layer table, contain rework data transferred into the network database 206 after standardization by the loading program 212.

The words outside the small bracket including Select, From and Where are instruction words. These three instruction words together form a group of inquiry instructions. The data within the Select instruction bracket is the data demanded by operators. The demanded data is usually displayed on a browser interface of the user computer 210. The data within the Where instruction bracket contains limiting conditions for a particular inquiry. Furthermore, the word "UNION" between to inquiry instructions combines the sets involved in both the upper and the lower inquiry.

In conclusion, this invention analyzes and integrates the rework reason of various machines so that rework reason and related data of each machine in whatever group can be easily obtained without manual manipulation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lithography analysis method for a system, including a network server and a user computer having a browser interface, wherein the method is used to sort and analyze a rework reason for a lithography rework with respect to a plurality of machines in a plurality of groups, the method comprising:

transferring all initial data of the machines to a network database for storage, wherein the network database holds batches of rework data;

inputting an analysis time node from the browser interface and transmitting the analysis time node to the network server;

retrieving a required data from the network server according to the analysis time node; and displaying the required data on the browser interface.

2. The analysis method of claim 1, wherein the rework data includes: a product number, a production line code, a station code, a department code, a product code, a mask, rework pieces, a measuring station, a production machine, an operator name, a rework reason code, a rework reason title, current status, wafer lot note items, a rework time and a rework region.

3. The analysis method of claim 1, wherein in an exemplary group, a group code and station code identical to that of the production machine belonging to the exemplary group of measuring stations is found from the rework data, each machine within the exemplary group has a corresponding machine code and the machine code of the production machine is a production machine code, wherein using the related production machine rework data from the network server includes:

determining if the machine's group code is equivalent to the group code of the measuring machine and the station code of the machine is the production machine code or not;

if the machine's group code is equivalent to the group code of the measuring machine and the station code of the machine is the production machine code, setting the machine as the production machine of the measuring machine; and if the machine's group code is not equivalent to the group code of the measuring machine and the station code of the machine is not the production machine code, searching for the next machine and comparing.

4. The analysis method of claim 1, wherein the machines in the same group as the production machine must perform an operation with an identical mask, causing the network server to obtain the required mask data related to the machine production operation by setting the machine mask equal to the production machine mask.

5. The analysis method of claim 1, wherein the network database contains all company worker's names, worker numbers and corresponding data, and the network server obtains a name of a worker performing a particular rework operation by:

determining if a worker number resides in the network database, using the worker number to retrieve the name of the worker performing the particular rework operation.

6. The analysis method of claim 1, wherein the network database includes a corresponding data between a rework reason title and a rework reason code, and the network server, to obtain the rework reason title and thereby the required data, automatically performs:

using the rework reason code to find the rework reason title from the network database, if the rework reason code resides in the network database.

7. The analysis method of claim 1, wherein to make a statistical analysis of a percentage of various rework reasons, processing for the network server includes:

a first inquiry: retrieving rework reason title, rework lot and rework pieces from rework data within the network database according to the analysis time node;

a second inquiry: retrieving production quantity at the input analysis time node and under the same conditions as the first inquiry step from the production quantity data within the network database; and finding a rework rate of various rework reasons according to the rework pieces and production pieces obtained from the first and the second inquiry: (rework pieces/production pieces).

8. The analysis method of claim 7, wherein to obtain a rework condition for a particular machine in a particular group when the rework reason is REG-overlap misalignment, the network server:

retrieves a machine name, rework lot, rework pieces and production pieces of the particular machine of the particular group from production quantity data of each machine in the network database according to the input analysis time node and the rework reason REG-overlap misalignment; and finds the rework rate of the particular machine within the particular group from the rework pieces and production pieces: (rework pieces/production pieces).

9. The analysis method of claim 1, wherein the browser interface further includes an input rework reason.

10. The analysis method of claim 9, wherein to obtain rework conditions for all machines when the rework reason is REG-overlap misalignment, the network server:

performs a first inquiry: retrieving data including manufacturing technique code, product code, mask, rework lot and rework pieces of all machines from the rework data within the network database according to the input analysis time node and the rework reason REG-overlap misalignment;

performs a second inquiry: retrieving data including manufacturing technique code, product code, mask, rework lot and production pieces with an input analysis time node under same conditions as the first inquiry from a production quantity data of each group within the network database; and finds the rework rate according to the rework pieces and production pieces obtained from the first and the second inquiry: (rework pieces/production pieces).

11. The analysis method of claim 9, wherein to obtain rework conditions for all machines when the rework reason is DCD (out of specification), the network server:

performs a first inquiry: retrieving data including manufacturing technique code, product code, mask, rework lot and rework pieces of all machines from the rework data within the network database according to the input analysis time node and the rework reason DCD (out of specification);

performs a second inquiry: retrieving data including manufacturing technique code, product code, mask and production pieces with an input analysis time node under the same condition as the first inquiry from the production quantity data of each group within the network database; and finds the rework rate according to the rework pieces and production pieces obtained from the first and the second inquiry: (rework pieces/production pieces).

12. The analysis method of claim 9, wherein to obtain rework conditions for a particular machine in a particular group when the rework reason is DCD-CD out of specification, the network server:

retrieves a machine name, rework lot, rework pieces, production pieces of the particular machine of the particular group from production quantity data of each machine in the network database according to the input analysis time node and the rework reason DCD-CD out of specification; and finds the rework rate of a particular machine within a particular group from the rework pieces and production pieces: (rework pieces/production pieces).

13. The analysis method of claim 9, wherein to obtain rework conditions for a particular machine in a particular group when the rework reason is hardware issue (including scanner down, track down, poor coating, arrow shade, defocus, poor development, abnormal focus, optical group shift or peeling, wafer tilt due to cleaning, no dummy pattern, no photoresist, wafer edge mark and reject wafer), the network server:

retrieves a machine name, rework lot, rework pieces and production pieces of the particular machine of the particular group from production quantity data of each machine in the network database according to the input analysis time node and the rework reason hardware issue; and finds the rework rate of a particular machine within a particular group from the rework pieces and production pieces: (rework pieces/production pieces).

14. The analysis method of claim 9, wherein to obtain rework condition for all machines when the rework reason is track down, stepper/scanner down or reject wafer, the network server:

retrieves a machine name, rework lot, rework pieces and production pieces of all the machines from the rework data of the network database according to the input analysis time node and the rework reason track down, stepper/scanner down, reject wafer; and finds the rework rate of all machines from the rework pieces and production pieces when the rework reason is track down, stepper/scanner down and reject wafer: (rework pieces/production pieces).

15. The analysis method of claim 9, wherein to obtain a rework condition for all machines when the rework reason is poor coating-incorrect overlay, the network server:

retrieves a machine name, rework lot, rework pieces and production pieces of all the machines from the rework data of the network database according to the input analysis time node and the rework reason poor coating-incorrect overlay; and finds the rework rate of all machines from the rework pieces and production pieces when the rework reason is poor coating-incorrect overlay: (rework pieces/production pieces).

16. The analysis method of claim 9, wherein to obtain rework condition for all machines when the rework reason is defocus-improper focus, the network server:

retrieves a machine name, rework lot, rework pieces and production pieces of all the machines from the rework data of the network database according to the input analysis time node and the rework reason defocus-improper focus; and finds the rework rate of all machines from the rework pieces and production pieces when the rework reason is defocus-improper focus: (rework pieces/production pieces).

17. The analysis method of claim 9, wherein to obtain a percentage ratio of rework pieces of all machines when the rework reason is out of date, non-lithography region request engineering test, test wafer, erroneous operation, pressure drop or earthquake, the network server:

retrieves a machine name, rework lot, rework pieces and production pieces of all the machines from the rework data in the network database according to the input analysis time node and the rework reason including out of date, non-lithography region request engineering test, test wafer, erroneous operation, pressure drop or earthquake; and finds the rework rate of all machines from the rework pieces and production pieces when the rework reason is out of date, non-lithography region request engineering test, test wafer, erroneous operation, pressure drop or earthquake: (rework pieces/production pieces).

18. The analysis method of claim 1, wherein the manufacturing technique code, the product code and the rework reason are input from the browser interface.

19. The analysis method of claim 18, wherein to obtain a percentage ratio of rework pieces of a particular group over the production pieces of all groups, the network server:

retrieves the manufacturing technique code, mask, rework lot, rework pieces and production pieces from the rework data of each group inside the network database according to the input manufacturing technique code, product code and analysis time node.

20. The analysis method of claim 18, wherein to obtain a percentage ratio of rework pieces of a particular group when the rework reason is REG-overlap misalignment over the production pieces of all groups, the network server:

retrieves the manufacturing technique code, mask, rework lot, rework pieces and production pieces from the rework data of each group inside the network database according to the input manufacturing technique code, product code, analysis time node and the rework reason REG-overlap misalignment.

21. The analysis method of claim 18, wherein to obtain a percentage ratio of rework pieces of a particular group when the rework reason is DCD (out of specification) over the production pieces of all groups, the network server:

retrieves the manufacturing technique code, mask, rework lot, rework pieces and production pieces from the rework data of each group inside the network database according to the input manufacturing technique code, product code, analysis time node and the rework reason DCD (out of specification).

22. The analysis method of claim 18, wherein to obtain a percentage ratio of rework pieces of a particular group when the rework reason is a hardware issue (scanner down, track down, poor coating, arrow shade, defocus, poor development, abnormal focus, optical group shift or peeling, wafer tilt due to cleaning, no dummy pattern, no photoresist, wafer edge mark or reject wafer) over the production pieces of all groups, the network server:

retrieves a manufacturing technique code, mask, rework lot, rework pieces and production pieces from the rework data of each group inside the network database according to the input manufacturing technique code, product code, analysis time node and the rework reason hardware issue.

23. The analysis method of claim 1, wherein the method further includes the step of standardizing the initial data by a loading program before transferring the standardized data to the network database for storage.

24. The analysis method of claim 23, wherein the standardized data produced by the loading program is stored in the network database, using data tables.

25. The analysis method of claim 24, wherein the production time of each data table is a piece of data recorded by the system.

26. A lithography rework analysis system, comprising:

a machine room having a plurality of machine groups undergo a serious of operations;

a network server for linking with a network database, wherein the network database is linked with the machine groups for storing comprising initial data and batches of rework data of the machine groups, and the network server processes data stored in the network database; and a user computer having a browser interface for inputting an analysis time node and displaying data retrieved by from the network server from the network database according to the analysis time node.

27. The rework analysis system of claim 26, wherein the rework data includes product number, production line code, station code, department code, product code, mask, rework pieces, measuring machine, production machine, worker name, rework reason code, rework reason title, current status, wafer lot note item, rework time and rework region.

28. The rework analysis system of claim 26, wherein the system further includes a loading program for standardizing initial data and transferring the standardized data to the network database.

29. The rework analysis system of claim 28, wherein the standardized initial data produced by the loading program is stored in data tables within the network database.

30. The rework analysis system of claim 29, wherein a production time of each data table is a piece of data recorded by the system.

* * * * *